(12) United States Patent
Probst et al.

(10) Patent No.: US 9,253,865 B2
(45) Date of Patent: Feb. 2, 2016

(54) METHOD OF CALIBRATING A DPP-GENERATED EUV LIGHT SOURCE

(71) Applicant: USHIO Denki Kabushiki Kaisha, Tokyo-to (JP)

(72) Inventors: Sven Walter Probst, Aachen (DE); Mohamad Hussein El-Husseini, Milmort (BE); Takahiro Hiraoka, Himeji (JP)

(73) Assignee: USHIO Denki Kabushiki Kaisha, Tokyo-to (JP)

(*) Notice: Subject to any disclaimer, the term of this patent is extended or adjusted under 35 U.S.C. 154(b) by 274 days.

(21) Appl. No.: 14/108,727

(22) Filed: Dec. 17, 2013

(65) Prior Publication Data

US 2014/0176005 A1    Jun. 26, 2014

(30) Foreign Application Priority Data

Dec. 21, 2012   (DE) .......................... 10 2012 113 007

(51) Int. Cl.
   *H05G 2/00*   (2006.01)

(52) U.S. Cl.
   CPC ..................... *H05G 2/003* (2013.01)

(58) Field of Classification Search
   CPC ..... H01J 49/0009; H05G 2/003; H05G 2/005; H05G 2/001; H05G 2/006
   See application file for complete search history.

(56) References Cited

U.S. PATENT DOCUMENTS

| | | | |
|---|---|---|---|
| 7,190,119 B2 * | 3/2007 | Patrick ................ | H01J 37/3299 118/723 I |
| 8,686,643 B2 * | 4/2014 | Taubert ................. | H05B 41/02 315/117 |

FOREIGN PATENT DOCUMENTS

| | | |
|---|---|---|
| DE | 10244105 B3 | 9/2004 |
| DE | 102006036173 A1 | 2/2008 |
| DE | 10219805 B4 | 3/2013 |
| WO | 0159891 A2 | 8/2001 |
| WO | 20010059891 A2 | 8/2001 |

\* cited by examiner

*Primary Examiner* — Hai L Nguyen
(74) *Attorney, Agent, or Firm* — Patentbar International, P.C.

(57) ABSTRACT

A method for controlling a discharge plasma-based radiation source for stabilizing a radiation dose emitted in a pulsed manner is disclosed. A calibration function is determined from a relationship between values of an input quantity and values of an operating parameter of the source by applying different values of the input quantity to the source. Reference value selected from the values of the operating parameter is brought about during a pulse of the source. The value of a test quantity is acquired at each pulse. Any quantity influencing the emitted radiation dose can be selected as test quantity. A statistical value is formed from a defined quantity of values of the test quantity. A deviation between the statistical value and the reference value is determined. A result of a comparison of the deviation with a predefined tolerance range determines whether the method is repeated.

12 Claims, 3 Drawing Sheets

METHOD OF CALIBRATING A DPP-GENERATED EUV LIGHT SOURCE

RELATED APPLICATIONS

This application claims priority to German Patent Application No. DE 10 2012 113 007.8, filed Dec. 21, 2012, which is incorporated herein by reference in its entirety.

FIELD OF THE INVENTION

The invention is directed to a method for controlling a discharge plasma-based radiation source for stabilizing the radiation dose which is emitted in a pulsed manner, particularly in an EUV radiation source for semiconductor lithography.

Electromagnetic radiation with wavelengths in the range of extreme ultraviolet (EUV) radiation in the 13.5 nm region is to be used for the next generation of semiconductor lithography machines. In this regard, it is particularly important that the EUV radiation which is generated in a pulsed manner be as uniform as possible.

One possibility for providing EUV radiation is to generate a discharge plasma between electrodes to which voltage is applied in a pulsed manner, the desired EUV radiation being emitted from this discharge plasma. A charging circuit based on a tuned circuit is used in the generation of the discharge plasma, this charging circuit providing discharge voltages at two electrodes at determined ignition times at which the plasma is to be generated. When the discharge voltage is applied between the electrodes, a gaseous, at least partially ionized emitter material is converted into a radiation-emitting plasma. However, due to various randomly occurring circumstances during plasma generation, the emitted radiation can fluctuate, for example, with respect to the energy thereof or the duration for which it is provided.

BACKGROUND OF THE INVENTION

It is known from WO 01/59891 A2, for example, to control radiation sources based on gas discharges by comparing a mean pulse energy or radiation dose with a corresponding reference value in order that an electric voltage, as discharge voltage, is adjusted by way of feedback such that deviations of the mean pulse energy or mean radiation dose from the reference value are minimized as far as possible.

Aside from pulse-to-pulse fluctuations, gradual deviations can also occur over a certain quantity of pulses. This drift, as it is called, may be caused, for example, by heating of components of the EUV radiation source and/or by wear of the components, for example, erosion of electrodes, depletion of the buffer gas, and so on.

If these drift-related deviations are offset by the control principle outlined above, the problem arises that increasingly larger deviations must be corrected with progressive drift. This imposes greater demands on the required measuring and control technology. In addition, as the deviations to be corrected increase, the absolute errors during the controlling process also increase, which is detrimental to a pulse-to-pulse stability of the EUV radiation.

SUMMARY OF THE INVENTION

It is the object of the invention to find a possibility for controlling a discharge plasma-based radiation source for stabilizing a radiation dose which is emitted in a pulsed manner in which occurrences of drift have a reduced influence on the pulse-to-pulse stability of the emitted radiation.

In a method for controlling a discharge plasma-based radiation source for stabilizing a radiation dose which is emitted in a pulsed manner, the above-stated object is met according to the invention through the following steps:

determining a calibration function as a mathematical relationship between values of an input quantity and values of an operating parameter of the radiation source by applying different values of the input quantity to the radiation source so that a reference value selected from the values of the operating parameter is brought about during a pulse of the radiation source;

acquiring a value of a test quantity at each pulse of the radiation source, wherein any quantity influencing the emitted radiation dose can be selected as test quantity;

deriving a statistical value from a defined quantity of values of the test quantity;

determining a deviation between the statistical value and the reference value;

comparing the deviation with a predefined tolerance range, and e1) returning to step b) if the predefined tolerance range has not been exceeded, or e2) returning to step a) for determining a new calibration function if the predefined tolerance range has been exceeded.

The core of the invention consists in that a decision criterion for deciding whether or not a new calibration function is determined is provided based on a dynamically generated value. By forming a new calibration function, drift effects occurring at the radiation source are at least partially offset and an improved pulse-to-pulse stability of the emitted radiation is achieved.

A defined quantity of values of the test quantity for forming the statistical value in step c) is preferably in a range of from 10 to 10,000 values. A statistical value, for example, is a mean value or a standard deviation.

In relation to the invention, operating parameter is understood to mean an influencing variable which is important for the operation of the radiation source, preferably an EUV radiation source. Examples of operating parameters are electric voltages (such as charging voltage of the capacitor bank, peaking circuit voltage or discharge voltage at the electrodes), pulse energy (for example, from the radiating plasma or at an intermediate focus of the EUV radiation source), discharge current, emitted radiation spectrum, generated plasma form or plasma temperature that is reached. Generally, the pulse energy (as output quantity of the radiation source) is a suitable operating parameter from which to select a specific value as reference value. The input quantity is another operating parameter, e.g., discharge voltage or some other electrical quantity which is required for the operation of the EUV radiation source. One of the operating parameters is selected as input quantity.

The calibration function is preferably determined by applying different values of the input quantity to the EUV radiation source. The corresponding values of the operating parameter from which the reference value is selected are assigned to the respective values of the input quantity. Using extrapolation or regression, the calibration function can accordingly be determined from the values found in this way. The calibration function which is determined in this way is a continuous function. The values found can also be compiled in tabular form and used as digital data.

Within the meaning of the invention, "applying to the radiation source" is understood to mean any way of providing physical quantities for the purpose of operating the radiation source. This also includes physical quantities which serve to influence the processes in and at the radiation source and which are not essential to the operation thereof. An example of "applying" is providing a discharge voltage at the radiation source for purposes of charging the electrodes.

In one configuration of the method according to the invention, a test quantity can be acquired at any location of the radiation source. For example, measuring devices, e.g., sensors, can be provided at the radiation source by means of which physical quantities such as electric voltages, electric currents, electric fields, pulse energies or properties of emitted radiation, the radiation spectrum, form of plasma or plasma temperature are acquired.

The test quantity can be influenced directly or indirectly by the input quantity. In a special case, the input quantity itself can also be used as test quantity.

Examples of directly influenced quantities are pulse energies or discharge currents. It is also possible to use a control quantity of the EUV radiation source as test quantity. However, values of an indirectly influenced quantity used for a pulse-to-pulse control of the EUV radiation source can also serve as test quantity. When controlling the EUV radiation source, these values are made available before a succeeding pulse and are not directly caused by the input quantity.

The reference value, the input quantity and the output quantity (response signal) can be selected from the same operating parameters or different operating parameters.

In a first embodiment of the method according to the invention, the reference value can be a pulse energy, the input quantity can be a selected electric voltage, and the test quantity can be a pulse energy which is specified as a control quantity.

A second embodiment of the method according to the invention is characterized in that the reference value is a selected electric voltage, the input quantity is an electric voltage selected as control quantity, and the test quantity is a measured electric voltage.

In a third embodiment of the method according to the invention, the reference value can be a pulse energy, the input quantity can be a selected electric voltage, and the test quantity can be a measured pulse energy.

In addition to or as an alternative to the electric voltages and pulse energies mentioned above, the test quantity and the operating parameter can be selected from a group of influencing quantities, output quantities or measured quantities comprising discharge current, radiation spectrum, plasma form or plasma temperature.

The invention makes it possible to realize a control of a discharge plasma-based radiation source for stabilizing a radiation dose which is emitted in a pulsed manner in which the influence of drift events on the pulse-to-pulse stability of the emitted radiation is reduced.

BRIEF DESCRIPTION OF THE DRAWINGS

The invention will be described more fully in the following with reference to embodiment examples and illustrations. The drawings show.

DETAILED DESCRIPTION OF THE PREFERRED EMBODIMENTS

Figure 1:
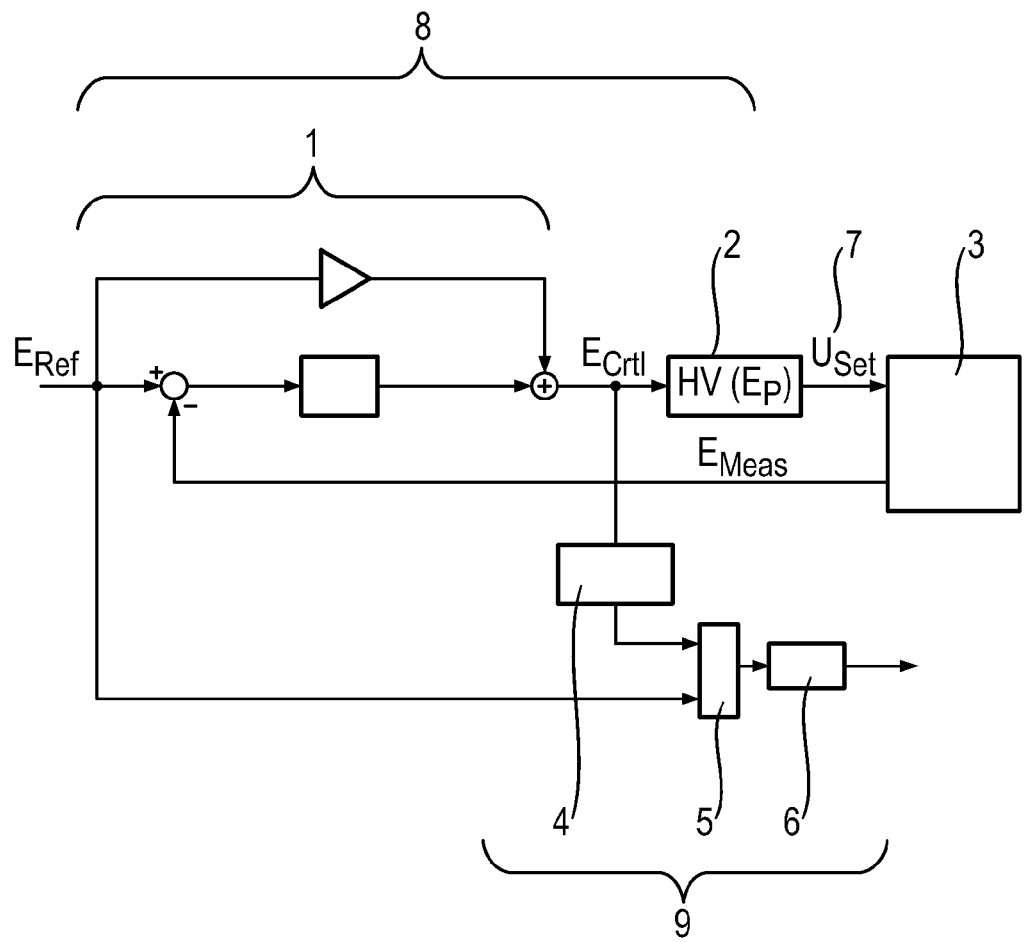
FIG. 1 is a schematic view of a first embodiment example of the method according to the invention.

In a first embodiment example, a device for controlling an EUV radiation source 3 is shown in a highly schematic manner. The essential elements of the device include a pulse energy control unit 1 (pulse dose controller, PDC), a translation unit 2, the EUV radiation source 3, an averaging unit 4, a comparison unit 5 and a decision unit 6.

The averaging unit 4 serves to form statistical values. In the first embodiment example, the statistical value is a mean value. A calibration function $HV(E_P)$ which is formed from the pulse energy values and the values of an electric voltage (discharge voltage) $U_{Set}$ corresponding to the pulse energy values as an input quantity 7 is stored in the translation unit 2. The input quantity 7 is applied to the EUV radiation source 3 for generating a pulse. To form the calibration function, a quantity of different discharge voltages $U_{Set}$ were selected as input quantity 7 and the latter was applied to the EUV radiation source 3. The pulse energies E caused by the respective values of the input quantity 7 were acquired in the EUV radiation source 3 and stored—so as to be associated with the values of the input quantity 7—as value pairs in the translation unit 2 so as to be repeatedly retrievable.

A calibration function $HV(E_P)$ (electric voltage as a function of pulse energy; HV=high voltage) was generated from the digital value pairs by means of a regression. The calibration function $HV(E_P)$ produces a mathematical relationship between the two operating parameters of discharge voltage as input quantity 7 and pulse energy E in the form of a continuous function (or alternatively $E_P(HV)$). In this way, it is possible to determine values of the first input quantity 7 and of the pulse energy E which correspond to one another and to assign these values to one another. In further embodiments of the device, the assignment scheme can also be provided in tabular form (e.g., lookup table).

A measured quantity and a first reference value $E_{Ref}$ are supplied to the pulse energy control unit 1 as input parameters. The measured quantity is a measured pulse energy $E_{Meas}$ which was acquired at the EUV radiation source 3. The first reference value $E_{Ref}$ is a value of a pulse energy E which is to be achieved in the EUV radiation source 3. This first reference value $E_{Ref}$ was selected as a value of the calibration function $HV(E_P)$. A corrected pulse energy $E_{Ctrl}$ is sent as output parameter of the pulse energy control unit 1 to the translation unit 2. Based on the calibration function $HV(E_P)$, the translation unit 2 translates the corrected pulse energy $E_{Ctrl}$ into a value of the first input quantity 7 which, in this example, is the electric voltage $U_{Set}$ applied to the EUV radiation source 3 in order to generate the next pulse. The pulse energy control unit 1 and the translation unit 2 collectively form a pulse-to-pulse control unit 8 of the EUV radiation source 3. Further, a calibrating unit 9 by means of which a drift of the calibration function $HV(E_P)$ can be detected is formed by the averaging unit 4, the comparison unit 5 and the decision unit 6 and the connection thereof to the pulse-to-pulse control unit 8.

During operation of the device shown in FIG. 1, a quantity of different electric voltages $U_{Set}$ is applied as first input quantity 7 to the EUV radiation source 3 beforehand and the pulse energy caused at every value of the input quantity 7 is acquired at the EUV radiation source 3 and stored as acquired pulse energy $E_{Meas}$. The value pairs from the values of the first input quantity 7 and the associated values of the acquired pulse energy $E_{Meas}$ are converted to the calibration function $HV(E_P)$ by means of regression and stored in the translation unit 2.

Next, the first reference value $E_{Ref}$ which is to be achieved in the EUV radiation source 3 during every pulse with the smallest possible deviations is determined. The value of the first input quantity 7 assigned to the first reference value $E_{Ref}$ is derived from the calibration function $HV(E_P)$ and is known as $U_{Set}$ (=$U_{Ref}$). This value of the first input quantity 7 is applied to the EUV radiation source 3, and a pulse, a gas discharge and a plasma generation with emission of EUV radiation are brought about. The pulse energy E occurring in so doing is acquired and supplied to the pulse-to-pulse control unit 8 as measured value $E_{Meas}$. The aimed-for first reference value $E_{Ref}$ is compared with the value of the measured quantity $E_{Meas}$ in the pulse-to-pulse control unit 8. Depending on the match found during the comparison, a value of the output quantity $E_{Ctrl}$ is generated and sent to the translation unit 2. The value of the output quantity $E_{Ctrl}$ is translated into an electric voltage $U_{Set}$ in the translation unit 2 and is applied to the EUV radiation source 3 for generating the next pulse. Based on the control procedure outlined above, the pulse-to-pulse control unit 8 is configured in the form of a feedback control as (controlled) pulse-to-pulse stabilization.

Further, the values of the output quantity $E_{Ctrl}$ are sent as a test quantity to the averaging unit 4 and stored therein. A determined quantity of temporally consecutive values of the output quantity $E_{Ctrl}$ was stored previously and a mean value was taken. This mean value is sent to the comparison unit 5 and compared therein with the first reference value $E_{Ref}$. In so doing, the difference between the two values, i.e., the deviation of the mean value from the first reference value $E_{Ref}$, is determined and the percentage by which the found deviation deviates from the first reference value $E_{Ref}$ is calculated. This deviation percentage is supplied to the decision unit 6 as a decision criterion on the basis of which the decision unit 6 decides whether a new calibration of the control of the EUV radiation source 3 should be carried out. If the comparison shows that the mean value does not deviate from the first reference value $E_{Ref}$ by more than a predefined tolerance range, for example, 5%, the tolerance range has been respected and no calibration is carried out. However, if deviations of more than 5% of the first reference value $E_{Ref}$ are determined and the tolerance range is accordingly exceeded, the decision unit 6 decides that a new calibration is to be initiated and a new calibration function $HV(E_P)$ is determined.

Figure 2:
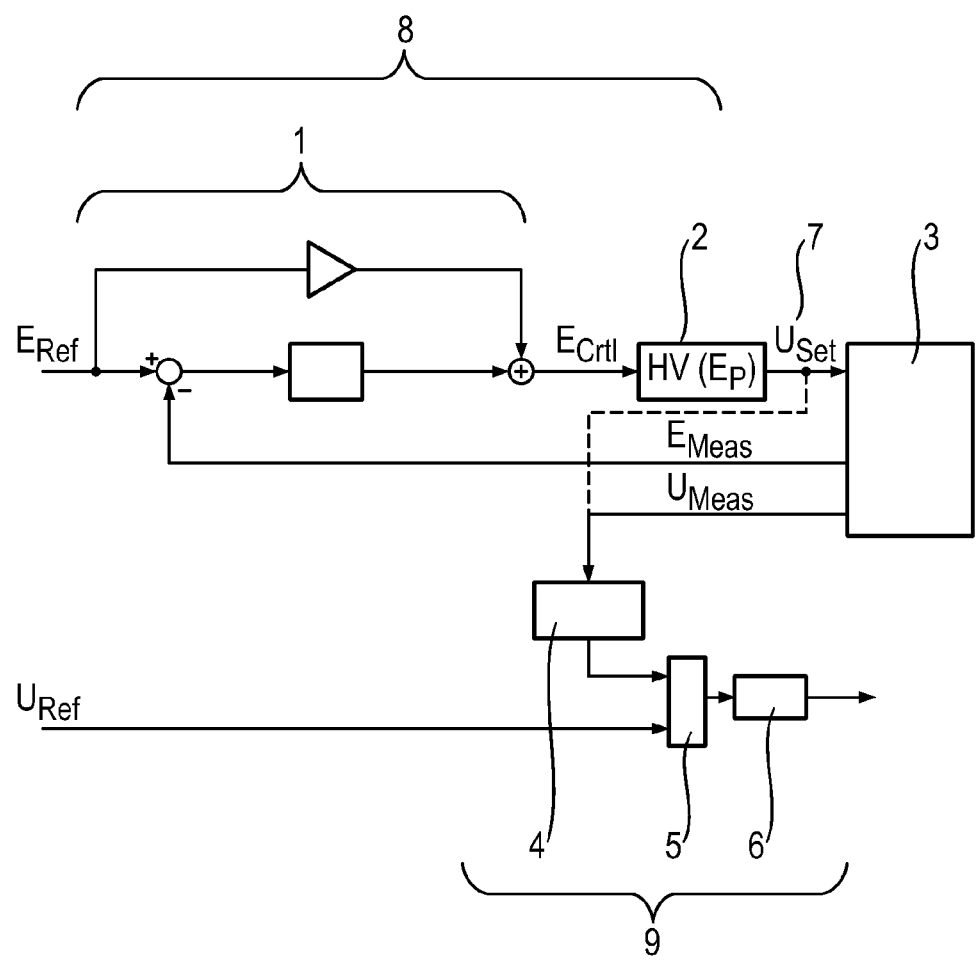
FIG. 2 is a schematic view of a second embodiment example of the method according to the invention.

In a second embodiment example according to FIG. 2, an electric voltage $U_{Meas}$ measured at the EUV radiation source 3 is used as test quantity. A mean value is formed in the averaging unit 4 from a quantity of values of this test quantity and is compared with a second reference value $U_{Ref}$ by the comparison unit 5. The second reference value $U_{Ref}$ is the electric voltage $U_{Set}$ which is assigned to the first reference value $E_{Ref}$ by the calibration function $HV(E_P)$.

If the deviation between the mean value and the second reference value $U_{Ref}$ is greater than the predefined tolerance range, the decision criterion for forming a new calibration function $HV(E_P)$ is sent to the decision unit 6. A decision for a new determination of the calibration function $HV(E_P)$ can further be made dependent upon the length of time expired since the last calibration function $HV(E_P)$ was formed in order to avoid rapidly succeeding determinations of the calibration function $HV(E_p)$. The pulse energy control unit 1, the translation unit 2 and the pulse-to-pulse control unit 8 correspond to the elements described with reference to FIG. 1.

Figure 3:
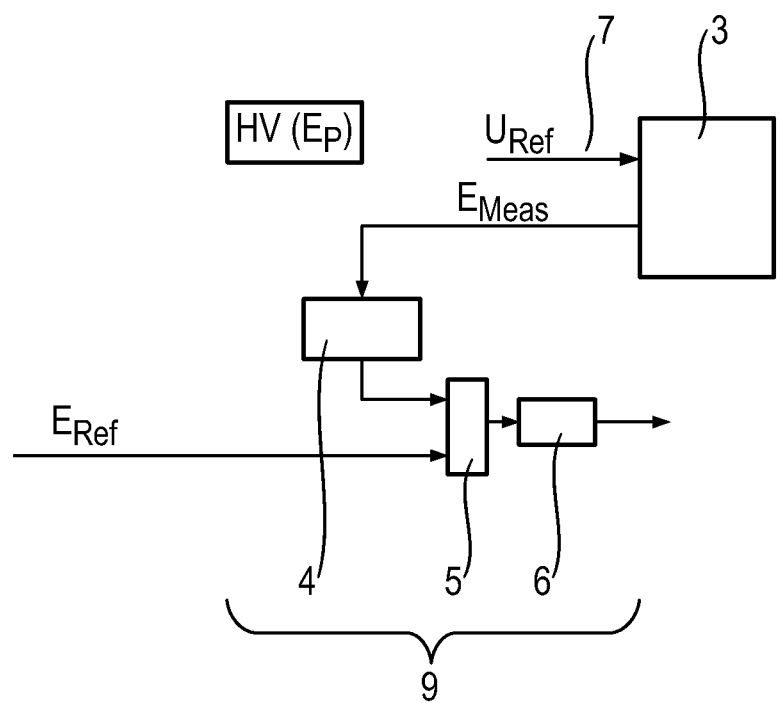
FIG. 3 is a schematic view of a third embodiment example of the method according to the invention.

A third embodiment example is shown schematically in FIG. 3. This simplified modified form of the method according to the invention makes do without a dynamic generation of new values of the first input quantity 7.

A constant value of the first input quantity 7 is applied to the EUV radiation source 3. An electric voltage $U_{Set}$ which is simultaneously a second reference value $U_{Ref}$ is selected as value of the first input quantity 7. A pulse energy $E_{Meas}$ brought about by the input quantity 7 is acquired at the EUV radiation source 3 as test quantity and is sent to the averaging unit 4. A mean value is formed from a quantity of values of the pulse energy $E_{Meas}$ and sent to the comparison unit 5. In the comparison unit 5, this mean value is compared with a first reference value $E_{Ref}$ which is the pulse energy value corresponding to the second reference value $U_{Ref}$ according to the calibration function $HV(E_P)$. The decision about a new determination of the calibration function $HV(E_p)$ is made by the decision unit 6.

While the first and second embodiment examples are suitable for continuously checking on the need for a new calibration function $HV(E_P)$ during ongoing operation (and can be used for recalibration, e.g., pauses between exposures), the third embodiment example can be carried out discontinuously without pulse-to-pulse stabilization.

REFERENCE NUMERALS 1 pulse energy control unit
2 translation unit
3 EUV radiation source
4 averaging unit
5 comparison unit
6 decision unit
7 input quantity
8 pulse-to-pulse control unit
9 calibration unit
$HV(E_P)$ calibration function
$E_{Ref}$ first reference value
$U_{Ref}$ second reference value
$U_{Set}$ electric voltage (discharge voltage)
$U_{Meas}$ measured electric voltage
$E_{Meas}$ acquired pulse energy
$E_{Ctrl}$ corrected pulse energy

What is claimed is:

1. A method for controlling a discharge plasma-based radiation source, the method comprising:
   a) determining a calibration function ($HV(E_P)$) corresponding to values of an input quantity and values of an operating parameter of the discharge plasma-based radiation source by applying different values of the input quantity to the radiation source so that a reference value ($E_{Ref}$, $U_{Ref}$) selected from the values of the operating parameter is brought about during a pulse of the radiation source;
   b) acquiring a value of a test quantity at each pulse of the radiation source, wherein any quantity influencing the emitted radiation dose can be selected as the test quantity;
   c) deriving a statistical value from a defined quantity of values of the test quantity;
   d) determining a deviation between the statistical value and the reference value ($E_{Ref}$, $U_{Ref}$);
   e) stabilizing a radiation dose emitted by the radiation source in a pulsed manner by comparing the deviation with a predefined tolerance range, and proceeding according to the result:
      e1) returning to step b) if the predefined tolerance range has not been exceeded, or
      e2) returning to step a) for determining a new calibration function ($HV(E_P)$) if the predefined tolerance range has been exceeded.

2. The method according to claim 1, further comprising using an influencing quantity of the radiation source as the test quantity in step b).

3. The method according to claim 2, further comprising using the input quantity as the test quantity.

4. The method according to claim 2, further comprising using a direct control quantity of the radiation source as the test quantity, the direct quantity being influenced directly by the input quantity.

5. The method according to claim 2, further comprising using an indirect control quantity of the radiation source as the test quantity, the indirect control quantity not being influenced directly by the input quantity.

6. The method according to claim 1, further comprising using a pulse energy as the reference value ($E_{Ref}$, $U_{Ref}$), using a selected electric voltage ($U_{Set}$) as the input quantity, and using the pulse energy as the test quantity, wherein the pulse energy is specified as a control quantity.

7. The method according to claim 1, further comprising using a selected electric voltage ($U_{Set}$) as the reference value ($E_{Ref}$, $U_{Ref}$), using a selected electric voltage ($U_{Set}$) as the input quantity, and using a measured electric voltage ($U_{Meas}$) as the test quantity.

8. The method according to claim 1, further comprising using a pulse energy as the reference value ($E_{Ref}$, $U_{Ref}$), using a selected electric voltage ($U_{Set}$) as the input quantity, and using a measured pulse energy ($E_{Meas}$) as the test quantity.

9. The method according to claim 1, further comprising selecting the test quantity and the operating parameter used for the reference value ($E_{Ref}$, $U_{Ref}$) from a group of influencing quantities consisting of a discharge current, a radiation spectrum, a plasma form, and a plasma temperature.

10. The method according to claim 1, further comprising acquiring the deviation from the reference value ($E_{Ref}$, $U_{Ref}$) as a percentage of the reference value ($E_{Ref}$, $U_{Ref}$) in step d).

11. The method according to claim 1, further comprising, prior to the return, adding an additional checking of a predetermined time period since the last return to step a) is added in step e2), followed up by:

e21) return to step b) if the predefined time period is not exceeded, or e22) return to step a) if the predefined time period is exceeded.

12. The method according to claim 1, wherein the discharge plasma-based radiation source is an EUV radiation source.

* * * * *